United States Patent
Pasternak et al.

(10) Patent No.: US 7,520,054 B2
(45) Date of Patent: Apr. 21, 2009

(54) PROCESS OF MANUFACTURING HIGH FREQUENCY DEVICE PACKAGES

(75) Inventors: Eliezer Pasternak, Palo Alto, CA (US); Sean Cahill, Palo Alto, CA (US); Bance Hom, Reno, NV (US)

(73) Assignee: Bridgewave Communications, Inc., Santa Clara, CA (US)

( * ) Notice: Subject to any disclaimer, the term of this patent is extended or adjusted under 35 U.S.C. 154(b) by 100 days.

(21) Appl. No.: 10/286,039

(22) Filed: Nov. 1, 2002

(65) Prior Publication Data

US 2003/0168250 A1 Sep. 11, 2003

Related U.S. Application Data

(62) Division of application No. 10/081,565, filed on Feb. 22, 2002, now Pat. No. 6,770,822.

(51) Int. Cl.
*H05K 3/10* (2006.01)
(52) U.S. Cl. ............... 29/852; 29/846; 205/125; 205/126; 205/167
(58) Field of Classification Search ............ 29/852, 29/846; 205/125, 126, 167, 170, 224; 361/760, 361/767, 783; 174/260–262, 264, 251, 255; 216/39, 38
See application file for complete search history.

(56) References Cited

U.S. PATENT DOCUMENTS

| | | | |
|---|---|---|---|
| 3,331,125 A | 7/1967 | McKusker | 29/578 |
| 3,391,455 A * | 7/1968 | Hirohata et al. | 29/852 X |
| 3,449,641 A | 6/1969 | Lee | 317/234 |
| 3,566,208 A | 2/1971 | Wang | 317/234 |
| 3,571,923 A * | 3/1971 | Shaheen et al. | 29/852 |
| 4,005,472 A | 1/1977 | Harris et al. | 357/71 |
| 4,486,945 A | 12/1984 | Aigoo | 29/588 |
| 4,581,291 A | 4/1986 | Bongianni | |
| 4,626,805 A | 12/1986 | Jones | |
| 4,642,160 A * | 2/1987 | Burgess | 29/852 X |
| 4,673,904 A | 6/1987 | Landis | |
| 4,776,087 A | 10/1988 | Cronin et al. | |
| 4,816,618 A | 3/1989 | Bongianni | |
| 4,909,909 A * | 3/1990 | Florjancic et al. | 205/125 |

(Continued)

FOREIGN PATENT DOCUMENTS

JP 402094693 4/1990

(Continued)

OTHER PUBLICATIONS

Topper et al., "Low Cost Electroless Copper Metallization of BCB for High-Density Wiring Systems", Advanced Packaging Materials: Processes, Properties and Interfaces, 1999 International Symposium on Advanced Packaging Materials, Mar. 1999 pp. 202-208.*

(Continued)

*Primary Examiner*—A. Dexter Tugbang
(74) *Attorney, Agent, or Firm*—DLA Piper LLP (US)

(57) ABSTRACT

A high frequency device packaging method is described wherein an insulating material, attached to a flat surface, is selectively etched and the etched insulating material is plated with a conductive material to form a center conductor for a coaxial via structure.

6 Claims, 4 Drawing Sheets

U.S. PATENT DOCUMENTS

| | | | | |
|---|---|---|---|---|
| 4,933,045 | A | * | 6/1990 | DiStefano et al. .......... 29/852 X |
| 4,945,856 | A | | 8/1990 | Stewart ...................... 118/715 |
| 4,959,900 | A | | 10/1990 | de Givry et al. ............... 29/840 |
| 5,045,151 | A | | 9/1991 | Edell ........................... 156/647 |
| 5,052,105 | A | | 10/1991 | Mische et al. |
| 5,108,553 | A | * | 4/1992 | Foster et al. ................ 205/125 |
| 5,151,770 | A | | 9/1992 | Inoue |
| 5,268,326 | A | | 12/1993 | Lesk et al. |
| 5,321,211 | A | | 6/1994 | Haslam et al. |
| 5,323,533 | A | | 6/1994 | Val |
| 5,405,808 | A | | 4/1995 | Rostoker et al. ............. 437/209 |
| 5,421,083 | A | * | 6/1995 | Suppelsa et al. ............... 29/852 |
| 5,479,053 | A | | 12/1995 | Oda |
| 5,509,200 | A | * | 4/1996 | Frankeny et al. .............. 29/852 |
| 5,517,747 | A | | 5/1996 | Pierro et al. |
| 5,524,339 | A | | 6/1996 | Gorowitz et al. ............... 29/841 |
| 5,576,518 | A | | 11/1996 | Shibuya et al. ............... 174/264 |
| 5,592,023 | A | | 1/1997 | Oda |
| 5,622,898 | A | | 4/1997 | Zechman |
| 5,656,830 | A | | 8/1997 | Zechman |
| 5,685,071 | A | | 11/1997 | Gates et al. .................... 29/840 |
| 5,757,252 | A | | 5/1998 | Cho et al. |
| 5,824,568 | A | | 10/1998 | Zechman |
| 5,834,375 | A | * | 11/1998 | Chen ........................ 216/38 X |
| 5,847,453 | A | | 12/1998 | Uematsu et al. ............. 257/728 |
| 5,930,665 | A | | 7/1999 | Cho et al. |
| 5,949,030 | A | * | 9/1999 | Fasano et al. .............. 29/852 X |
| 6,039,889 | A | * | 3/2000 | Zhang et al. ............... 216/39 X |
| 6,049,122 | A | | 4/2000 | Yoneda ....................... 257/668 |
| 6,061,248 | A | | 5/2000 | Otani et al. .................. 361/777 |
| 6,123,825 | A | * | 9/2000 | Uzoh et al. .............. 205/224 X |
| 6,191,492 | B1 | | 2/2001 | Yamazaki et al. ............ 257/787 |
| 6,192,577 | B1 | | 2/2001 | Larsson ........................ 29/840 |
| 6,388,198 | B1 | * | 5/2002 | Bertin et al. ................ 174/251 |
| 6,448,510 | B1 | | 9/2002 | Neftin et al. ................ 174/264 |
| 6,465,896 | B1 | | 10/2002 | Norskov et al. ............. 257/784 |
| 6,590,479 | B2 | | 7/2003 | Yoshida et al. .............. 333/260 |

FOREIGN PATENT DOCUMENTS

| | | | | |
|---|---|---|---|---|
| JP | 5-175661 | * | 7/1993 | .................. 29/852 |
| JP | 2001015654 A | | 1/2001 | |
| JP | 02001352166 A | | 12/2001 | |

OTHER PUBLICATIONS

PCT Search Report dated Sep. 4, 2003 corresponding to PCT/US03/05297.

* cited by examiner

PROCESS OF MANUFACTURING HIGH FREQUENCY DEVICE PACKAGES

This is a divisional of Application Ser. No. 10/081,565, filed on Feb. 22,2002, now U.S. Pat. No. 6,770,822 entitled: HIGH FREQUENCY DEVICE PACKAGES AND METHODS which has now issued as U.S. Patent No. 6.770.822 on Aug. 3. 2004.

FIELD OF THE INVENTION

This invention relates generally to a method for fabricating high frequency device packages and high frequency packages and in particular to a method for fabricating a high frequency package having coaxial vias and coaxial leads.

BACKGROUND OF THE INVENTION

As electronic devices and components are operating at higher and higher speeds and increasing frequency ranges, the packaging of the devices becomes an increasing cause of performance degradation. Therefore it is customary to mount semiconductor devices that operate at microwave frequencies directly onto the circuit substrate. This mounting process requires wire bonding or solder-bump mounting. These bonding and mounting techniques have several drawbacks and limitations. For example, the mounting substrate must be rigid for precise mounting and bonding, but such rigid substrates are expensive when large areas are included. In addition, the cost of the microwave device package is further increased due to low wire bond yields, If inverse-die solder bump mounting is used, it may require air cavities trenched onto the substrate to minimize radio frequency (RF) effects on the die circuitry. These trenches, however, are difficult to manufacture. Furthermore, the added inductive reactance of the bond wires requires precise mounting and manual adjustment for repeatable performance. The bond wires also radiate energy causing undesirable energy losses and undesirable cross talk.

There is clearly a need to package such high frequency devices in a surface mount package that can be machine picked and placed onto a printed circuit board. Typically, the interconnections on a printed circuit can maintain controlled impedance and critical connections can be shielded using ground planes and multi layered techniques. It is desirable, however, also to maintain controlled impedance throughout the integrated circuit (IC) package itself. For example, U.S. Pat. No. 5,323,533 to Christian Val (the '533 Patent) discloses a surface-mounted package whose wire bonds and leads have controlled impedance and a coaxial structure. However, the packaging described in the '533 Patent still has some limitations in high-frequency applications. In particular, a bond wire connects the electric component to a pad on the package periphery in the '533 Patent. That pad in turn extends to become the center lead of the package. It is difficult to maintain constant impedance along the bond-wire to pad transition. In addition, it is also difficult to completely shield this connection and it is difficult to maintain the mechanical precision of spacing between those leads, as each lead is extended separately from the main package and those leads tend to bend with mechanical stress of temperature changes.

Thus, its desirable to provide a high frequency packaging method and high frequency device package and it is to this end that the present invention is directed.

SUMMARY OF THE INVENTION

The high frequency device package and packing method in accordance with the invention addresses the above problems. The invention provides a device package with coaxial via connections right through the base of the package. The via structures in the base are precisely fabricated based on photolithography or similar Micro System Technology (MST) techniques well known and currently available in the semiconductor and printed circuit industries. In accordance with the invention, rather than connecting a wire bond to a pad, a wire bond goes directly to the center pin of the coaxial via. The invention includes a method for maintaining the impedance along the entire signal route. An added benefit of this invention is the high density of connections that are feasible by the ability to arrange the coaxial via holes in a two dimensional array, similar to existing ball grid array packages. In accordance with the invention, this package is suitable for high speed digital applications at multi-GHz switching rates.

Thus, in accordance with the invention, an electrical component package is provided that comprises a substantially flat base to accommodate one or more electrical components on its surface and one or more coaxial vias formed in the base for input/output of electrical signals from the electrical component. In accordance with another aspect of the invention, a structure is provided. The structure has an electrical device having at least one conductive pad and a base material to which the electrical device is mounted wherein the base has at least one coaxial via. The structure further comprises a micro-coaxial wire connecting said pad to a conductor in said coaxial via to provide a coaxial signal path from the electrical device to the coaxial via.

In accordance with another aspect of the invention, a method of fabricating coaxial electrical interconnections between a component and a coaxial via is described. In a first step, a wire is placed between said component and a conductive portion of a coaxial via. Next, a conformal coating is applied to the wire and the component with dielectric material. Finally, the dielectric material is conformally coated with a conductive material to form coaxial wires between the component and the coaxial via. In accordance with yet another aspect of the invention, a method of fabricating a base structure with coaxial vias is provided. The method comprises selectively etching an insulating material attached to a flat surface and plating said etched insulating material with a conductive material to form a center conductor for a coaxial via structure.

In accordance with yet another aspect of the invention, a high frequency component package is provided. The package comprises a substantially flat base to accommodate one or more electrical components on its surface and one or more via holes formed in the base to permit signals from the electrical components to pass through the base. Each via hole further comprises a central conductive contact area surrounded by an insulating material ring such that the central conductive contact area, the insulating material ring around the central conductive contact area and the base form a coaxial via connection.

In accordance with another aspect of the invention, a packaged high frequency device is provided. The device comprises a substantially flat base having a high frequency device bonded on its surface wherein the high frequency device has a plurality of bonding pads. The device also has one or more via holes formed in the base to permit signals from the electrical components to pass through the base wherein each via hole further comprises a central conductive contact area surrounded by an insulating material ring such that the central conductive contact area, the insulating material ring around the central conductive contact area and the base form a coaxial via connection. The device also has one or more coaxial bonding wires that connect the bonding pads of the high frequency device to the one or more coaxial via holes in the base wherein each coaxial bonding wire further comprises a conductive bonding wire and a conformal coating of insulating material that surrounds the conductive bonding wire so that the signals are carried by a coaxial structure from the device out through the base.

DETAILED DESCRIPTION OF A PREFERRED EMBODIMENT

The invention is particularly applicable to microwave device packaging and it is in this context that the invention will be described. It will be appreciated, however, that the high frequency device package and packing method in accordance with the invention has greater utility since it can be used to package any device that operates a high frequencies or any device in which matched impedance vias and bonding wires are desirable.

Figure 1:
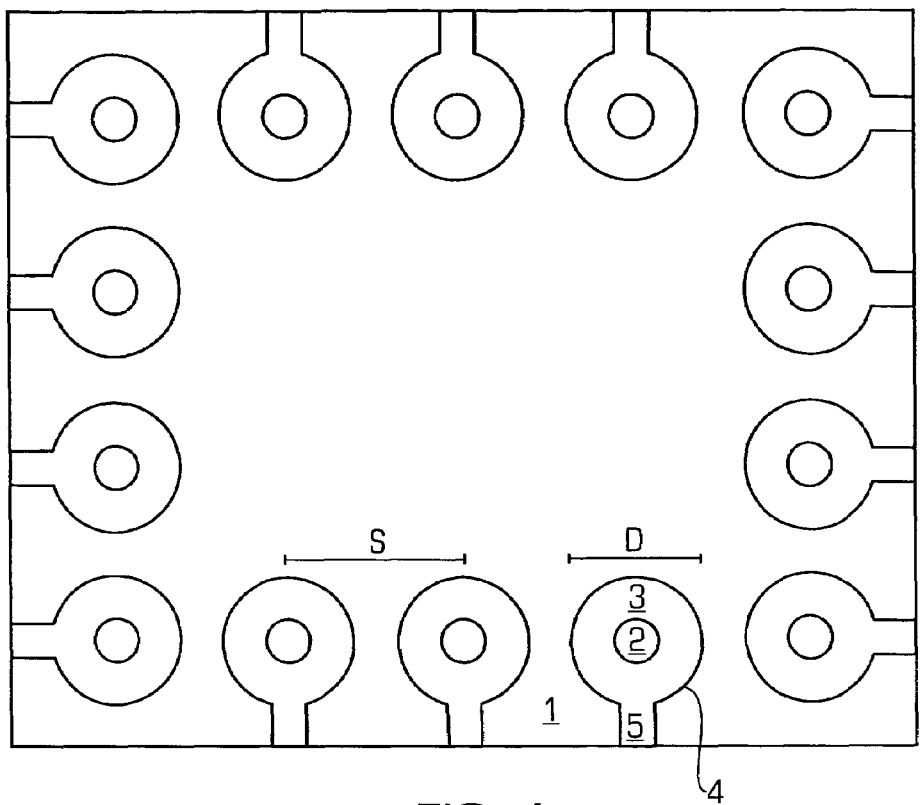
FIG. 1 shows a bottom view of a package base in accordance with the invention having coaxial via connections.

FIG. 1 is a bottom view of a package with coaxial via holes in accordance with the invention. The package may include a flat base 1 that is preferably coated with a material, such as tin, that enhances the ability to solder to the flat base. The package may further include a plurality of coaxial via connections laid out in a particular configuration such as the arrangement shown in FIG. 1. Each coaxial via connection may further include a central contact area 2 made of a conductive material to which an electrical connection may be made, an insulating ring 3, made of an insulating material, which is shaded in FIG. 1 for easy identification and surrounds the central contact area 2 to form the coaxial structure. Each coaxial via connection further includes a shield side 4 which is formed by the conductive base 1. For surface mounting purposes, the conducting surfaces of the base 1 and central contact area 2 are raised relative to the insulation ring. The insulating rings 3 are protected from damage by a solder mask layer 16 seen in FIG. 2. The solder mask may extend to the edge of the base 1 to form a channel 5 which creates a passage for fluid and vacuum cleaning of debris and solder bridges during the printed circuit board mounting process.

The base 1 should preferably be made of a material that is a good heat conductor and forms a good electrical shield so that the base can effectively conduct heat away from the device inside the package and so that the base shields the rest of the circuitry from the microwave energy and signals generated by the device inside the package. Preferably, the base may be made of either metal, such as copper, or an electrically insulating material that is metal plated, such as Aluminum Nitride (AlN). It is desirable that the thermal expansion coefficient of the base 1 and the die materials are matched. The spacing between center holes, S, is 1 mm, while the diameter, D, of each via hole is determined by the desired impedance characteristics. As the demand increases for more pins on the package or smaller package dimensions, the spacing between the center holes can be reduced. It is usually the dimensional tolerances of the external printed circuit (PC) board that will limit the degree of miniaturization of the base connections.

Figure 2:
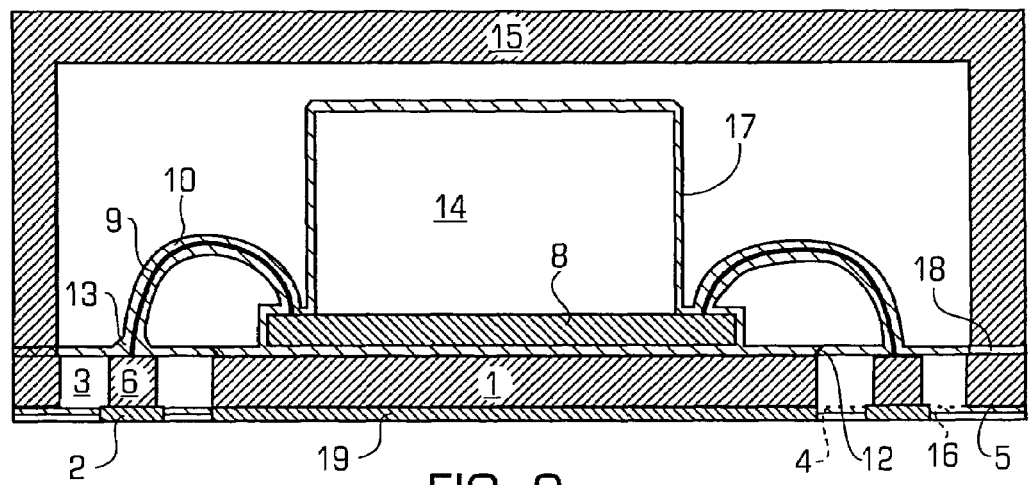
FIG. 2 shows a cross section of a package in accordance with the invention containing coaxial via connections.

FIG. 2 shows a cross sectional view of a preferred embodiment of a packaged device 20 in accordance with the invention. In the preferred embodiment, the base 1 is made of a copper alloy that conducts both electricity and heat. The base may be plated with a layer 19, such as tin, for solderability. An electrical component/device 8, such as a semiconductor die, is mounted on the base 1 using well known techniques. The package may include one or more coaxial via holes that correspond and align with the coaxial via connections shown in FIG. 1. As shown in FIG. 2, each coaxial via hole may include a conductive center pin 6 that is surrounded by the insulator rings 3. The insulating ring 3 is enclosed by the base material 1. The bottom end of each pin 6 may be further coated/plated with a conductive layer 2, such as metal, wherein the conductive layer 2 associated with each coaxial via hole is larger in diameter than the conductive center pin 6 to facilitate easy solder bonding to a printed circuit board and to maintain the desired characteristic impedance, which requires a larger diameter than the conductive center pin 6 surrounded by the insulating ring 3. The preferred material for the insulating ring 3 is glazed SU-8, which combines lithography fabrication capability and good high-frequency performance. Another preferred material is Teflon, for its low dielectric constant an good high-frequency performance.

The packaged device further may include one or more electrical wires 9 that connect the well known pads (not shown) of the die 8 with the center conductive pins 6. The wires conduct signals from the pads of the die to the conductive center pin as is well known. In accordance with the invention, the wires, along with the rest of the exposed structures inside of the packaged device are coated with an insulating layer 10, such as any dielectric and preferably Parylene, and a shield 17 is formed over the top of the insulating layer by an external metal coating of the insulating layer. The thickness of the preferred metal layer should be chosen in consideration of skin-depth and DC resistance issues and should be composed primarily of an excellent electrical conductor such as silver, copper, or gold. For most applications, 1 micron coating thickness is adequate. The insulating layer 10 is exposed by well known techniques, such as laser etching, in some areas 12, which are then metal plated as a continuation of the shield 17 to enable grounding to the base structure. In accordance with the invention, the combination of the bond wire insulation 10 and shield 17 form a microcoaxial cable having an inner conductive layer (the bond wire 9), an insulator surrounding the inner conductive layer (the insulating layer 10) and the outer grounded conductive layer (the shield 17). The impedance of the cable can be selectively controlled for each wire (and hence for each bonding pad and for each signal) by choosing a different diameter for the bond wire. Thus, if the thickness of the insulating layer 10 is uniform on all wires, the impedance will vary with the diameter of each bond wire.

To improve the high frequency performance at the transition between the micro-coaxial cable and the transition to another contact geometry, it is possible to create a tapered contact 13 between the bond wire 9 and the other contact, such as a center conducting pin 6. The taper may be generated in accordance with the invention as a part of the well known bonding process known as capillary ball, or it can be added as a secondary step by applying solder or solder paste to the bond area. For frequencies below 100 GHz, both ball-bonding and wedge-bonding technique may have acceptable performance. The insulation layer 10 in the area of the tapered contact 13 also may be thickened around the taper 13 to maintain the desired characteristic impedance. In contacts that are not frequency-critical (e.g., contacts or bonding wires carrying power signals or other non-high frequency signals), the taper may be omitted.

In accordance with the invention, an air gap 14 may be left above most of the surface area of the die 8 as shown to maintain the electromagnetic characteristics of the die surface. This air gap may be formed in various ways such as by placing a tape on the die that is removed after the coating of the insulator layer and metal layer. Another alternative to generate the air gap is to place a sacrificial layer where air gaps are desired. The insulator and metal coatings are then pierced mechanically and the sacrificial layer may be dissolved out. Yet another option is to attach a foam material to the die 8 that will remain on top of the die 8 after the coatings with negligible effects.

Once all of the coatings have been completed and the air gaps provided (is needed), the base 1, with the device mounted and connected by micro-coaxial cables to the via holes, is then enclosed by an encapsulation material or by a lid 15 as shown to seal the die 8 inside of the package as is well known. The lid 15 may be made of metal and soldered or epoxy glued to the base at one or more contact area 18. Then, as described above, a solder layer 19 may be applied to the bottom of the packaged device to protect the insulating rings 3 as described above. Now, a preferred method for manufacturing the base with the coaxial via holes in accordance with the invention will be described.

Figure 3A:
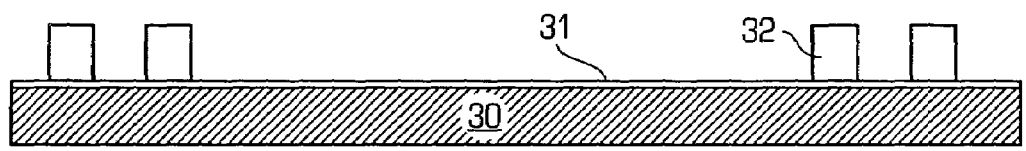
FIGS. 3A-3D shows a cross sectional view of the process steps in accordance with the invention to manufacture a package base with coaxial via holes.

FIGS. 3A-3D illustrate a preferred process for manufacturing a base with via holes in accordance with the invention. A first step A is shown in FIG. 3A. In step A, a foundation plate 30, preferably made of glass or silicon, is coated with an adhesive layer 31. Then, an insulating material is formed on top of the adhesive layer 31 in the shape of the insulating via rings 32. These rings are preferably formed by first depositing a uniform layer of photo resist material on the adhesive 31 and then photo etching the undesired parts to leave the desired via rings 32. A suitable photo resist to generate these via rings 32 is commercially available under the name SU-8.

An few additional steps/operations might be done in Step A to improve the via conductor bonding performance. For example, the adhesive layer 31 may be based on aluminum deposition wherein the aluminum is used as a sacrificial layer. Then, after the insulating via rings 32 have been formed, the exposed aluminum is coated with a thin layer of gold and possibly a subsequent nickel layer to improve bondability and aging characteristics.

Figure 3B:
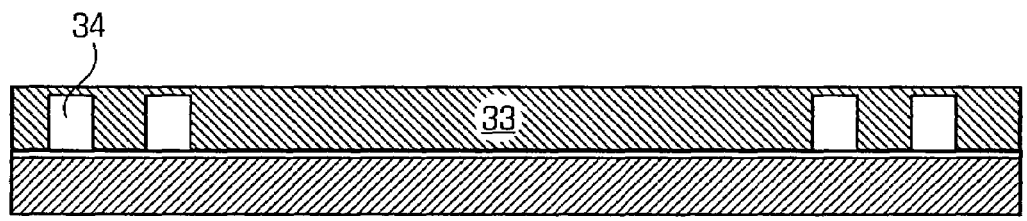

FIG. 3B illustrates Step B. In Step B, the entire top of the foundation 30 including the via rings and the adhesive layer 31 are plated with a metal layer 33, that may be, for example, copper. Any excess build up of metal can be removed by polishing the metal layer down to the via holes top line 34 so that the metal layer has the same height as the top of the via holes and the top surface is planar.

Figure 3C:
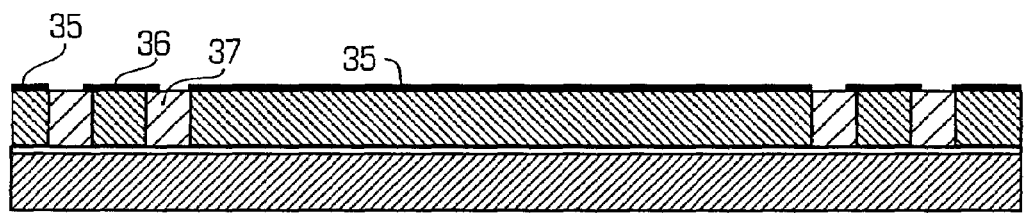
Figure 3D:
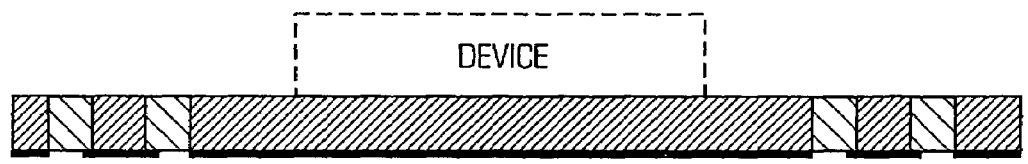

FIG. 3C illustrates Step C while FIG. 3D illustrates Step D. In step C, the now exposed via holes may be coated with a solder mask layer 35 and a tin layer 36 in processes of deposition and etching similar to conventional metal layers processing in printed circuit boards. This layer which will become the bottom side of the base 1 which is heat conductive and electrically conductive as described above. Next, the adhesive layer 31 is removed or dissolved which separates the foundation 30 from the rest of the metal base. The metal base is now turned upside down, as shown in step D, to facilitate device mounting wherein a device is mounted on the top of the base (as shown in phantom in FIG. 3D). It is anticipated that the device mounting will be a separate process that does not necessarily need to occur immediately after the fabrication of the base. If the base had been plated with gold and nickel as a part of Step A as described above, the gold becomes the outside layer onto which the wire bonding is performed and the nickel serves as a bond-barrier layer.

The insulating rings 37 may be glazed by beat treatment to create a more stable seal with better herneticity. For example, a base containing SU-8 via insulators is annealed at elevated temperatures around 130° C. to 200° C. for about 30 minutes. This heat treatment is preferably done after completion of step B.

Typical metallization of parylene-coated materials require subjecting the materials to large electric fields or RF energy, as contained in a sputtering process. Such exposure could damage the mounted electronic components. To avoid this potentially damaging process, one may implement a process based on catalyzation and electroless-plating. Subsequent electroplating is then possible. As an example, the material is exposed to a chemical surface treatment, and then immersed in a solution containing an activated palladium compound. This latter solution creates a surface layer that has autocatalytic properties. Subsequent exposure to a solution containing a species, such as copper ions, will promote the formation of a continuous copper seed layer, which subsequently builds to a copper plated layer.

To package the device, the base material is mounted on a solid carrier such as silicon or glass, with the tin-plated side attached to the plate. Next, the die is bonded to the desired location on the base. Then, the die is wire bonded and tapered-end-contacts are made by a mechanical tapering process, by depositing solder paste and then heat-reflowing it, or excess solder is deposited on the center pins 6, to be heat-reflown, or a combination of the described approaches. The air gap sacrificial material as described above is then attached to the die surface. The entire structure is then conformally coated with insulating material, preferably parylene, although various other insulating materials may be used such as plasma-deposited fluoropolymers, or other similarly conformal coatings. To enable metallic via connections through the parylene layer, sections of the coating are removed by a process, such as laser beam ablation, followed by metallization, or, alternatively, metallization of the parylene layer occurs first, then selective metal sections are etched, the exposed insulators are plasma etched and the entire area is metallized again. Metallization is performed by plating or vapor deposition.

In accordance with the invention, it is possible to mount several devices on the base surface. It is then possible to create wire-bond contacts between bonding pads on these devices and include these wires in the micro coaxial formation process in parallel with the wires connected to base via pins. This allows the implementation of a hybrid structure with internal micro coaxial interconnects.

Figure 4:
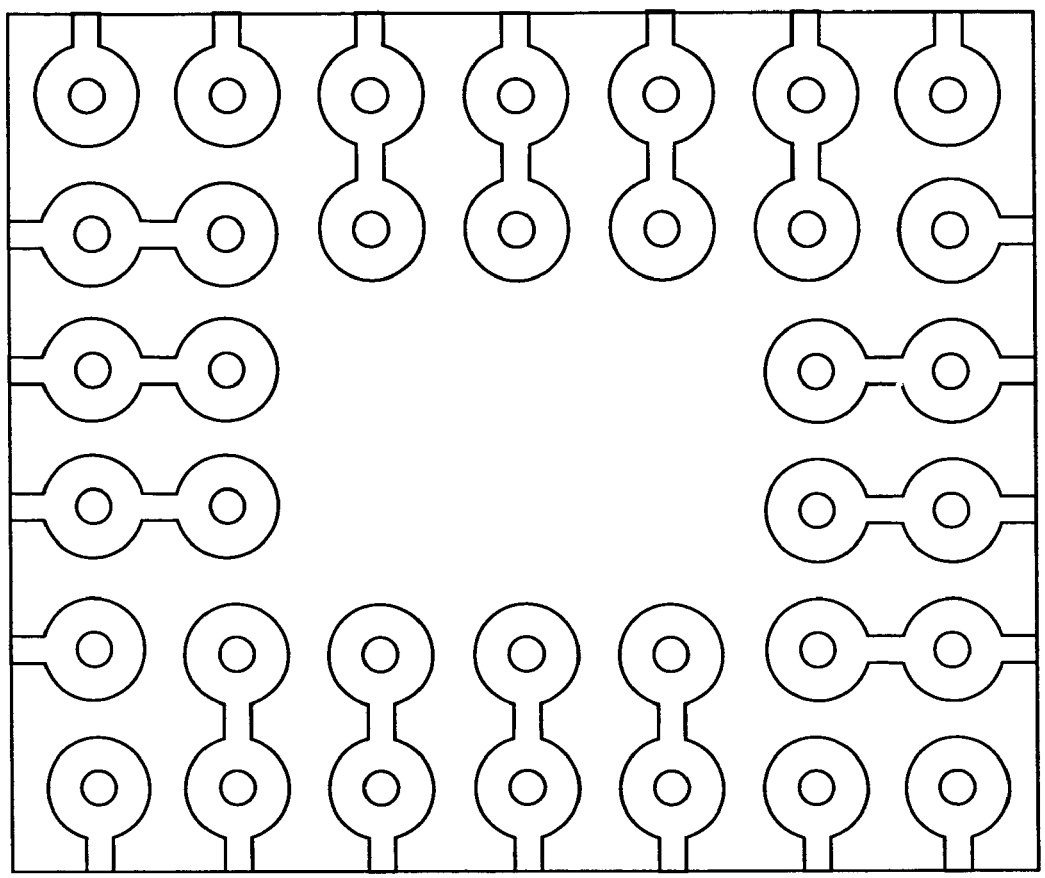
FIG. 4 shows a bottom view of a second embodiment of the package base in accordance with the invention with via holes arranged in more than a single row.

While the above examples illustrate a low pin count device, the number of via holes can be extended significantly in accordance with the invention. An example of an array arrangement of via holes that can be generated using the present invention is shown in FIG. 4. Given the lithographic process of manufacturing such via holes, the holes can be arranged in any desired pattern and need not have identical dimensions.

Figure 5:
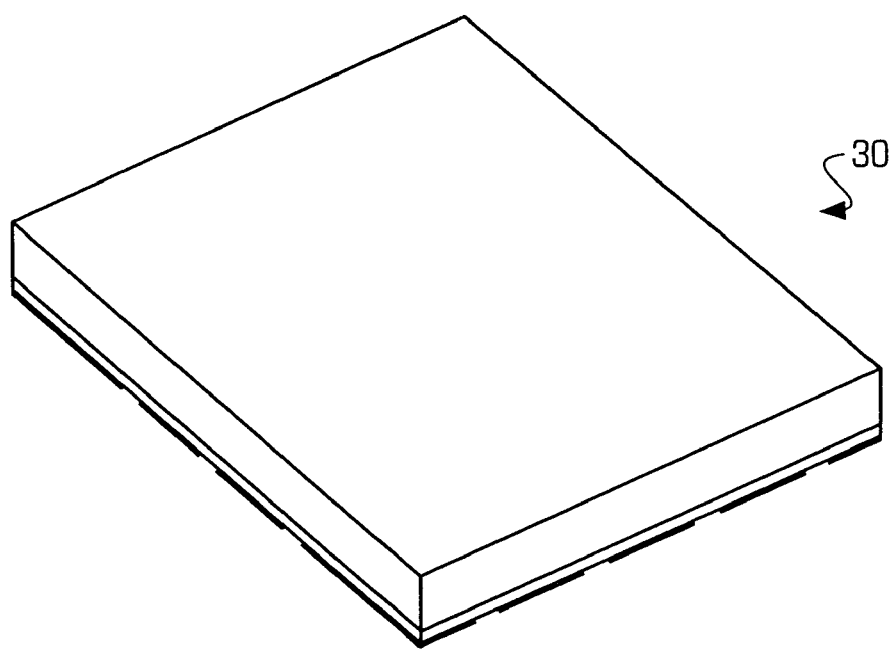
FIG. 5 shows an external top view of a complete high frequency device package in accordance with the invention.
Figure 6:
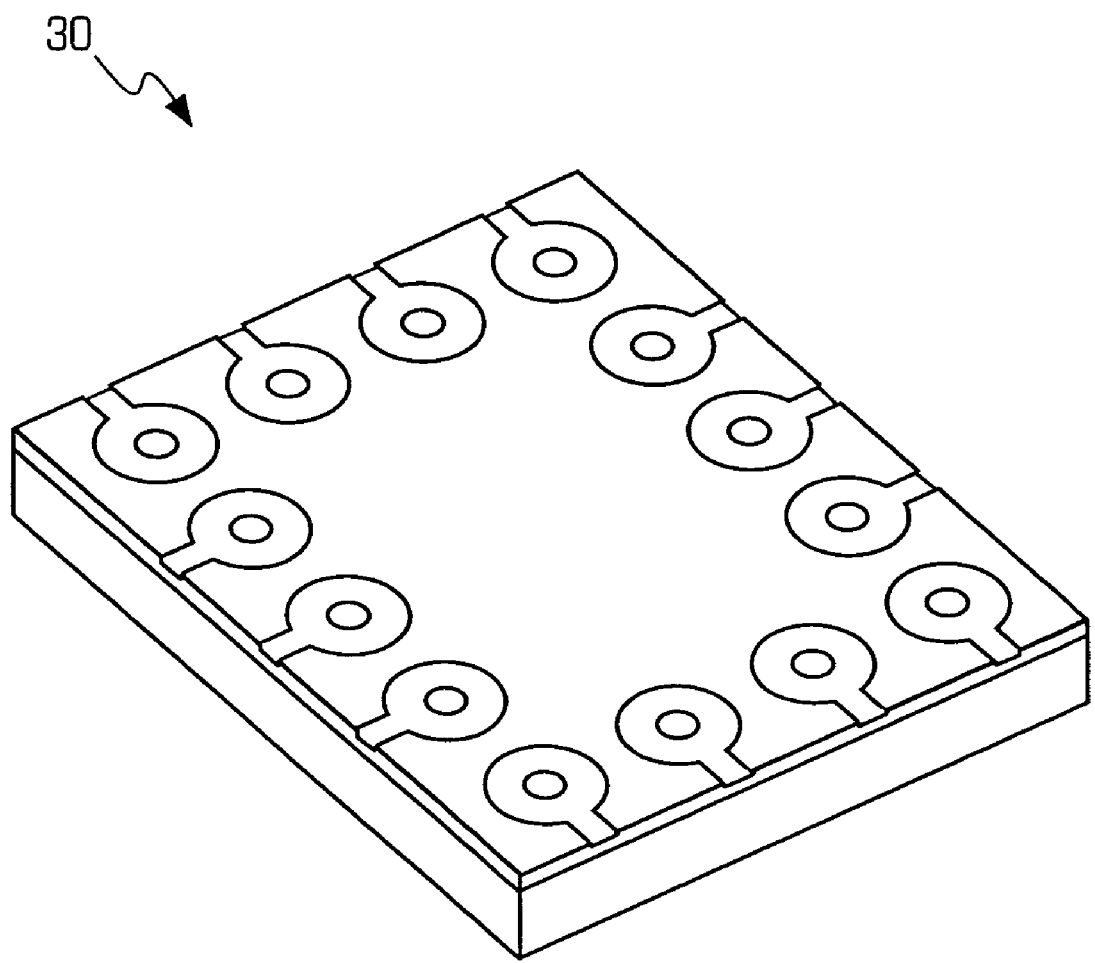
FIG. 6 shows an external bottom view of the complete high frequency device package shown in FIG. 5.

FIGS. 5 and 6 illustrate a completed packaged device 30 in accordance with the invention. FIG. 5 is a top view of the packaged device while FIG. 6 is a bottom view of the packaged device that shows the via hole connections in accordance with the invention.

An estimated loss of the bond wire based on skin-depth loss theory has shown that the loss at a frequency of 50 GHz is 0.018 dB/mm for a 2-mil diameter bond wire. Since most microwave bond wires are a fraction of millimeter long, this performance is adequate. The alternative non-coaxial bondwire losses at 50 GHz are in the order of magnitude several dB if the wire inductance is not matched, and matching is applicable to a narrow frequency range.

While the foregoing has been with reference to a particular embodiment of the invention, it will be appreciated by those skilled in the art that changes in this embodiment may be made without departing from the principles and spirit of the invention, the scope of which is defined by the appended claims.

The invention claimed is:

1. A method of fabricating a conductive base structure with coaxial vias, comprising:
    selectively patterning an insulating material attached to a foundation layer to form an etched insulating material;
    plating said etched insulating material with a conductive material to form the conductive base structure that includes a center conductor and a conductive shield surrounding the etched insulating material; and
    separating the foundation layer from the etched insulating material, the center conductor, and the conductive shield, to form a coaxial via structure through the conductive base structure.

2. The method of claim 1, wherein the insulating material comprises SU-8.

3. The method of claim 2 farther comprising glazing said insulating material layer.

4. The method of claim 1 further comprising applying an adhesive layer to secure the insulating material to the foundation layer.

5. The method of claim 4, wherein applying the adhesive layer further comprises plating the adhesive layer with gold.

6. The method of claim 4, wherein applying the adhesive layer further comprises plating the adhesive layer with gold and then nickel.

* * * * *